United States Patent
Nakane

(10) Patent No.: US 11,435,310 B2
(45) Date of Patent: Sep. 6, 2022

(54) HUMIDITY SENSOR

(71) Applicant: Taketomo Nakane, Tokyo (JP)

(72) Inventor: Taketomo Nakane, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 363 days.

(21) Appl. No.: 16/491,247

(22) PCT Filed: Feb. 26, 2018

(86) PCT No.: PCT/JP2018/007053
§ 371 (c)(1),
(2) Date: Sep. 5, 2019

(87) PCT Pub. No.: WO2018/180107
PCT Pub. Date: Oct. 4, 2018

(65) Prior Publication Data
US 2020/0033285 A1    Jan. 30, 2020

(30) Foreign Application Priority Data

Mar. 31, 2017   (JP) .............................. JP2017-071469

(51) Int. Cl.
*G01N 27/22*    (2006.01)
*G01N 27/04*    (2006.01)
(Continued)

(52) U.S. Cl.
CPC .......... *G01N 27/223* (2013.01); *G01N 27/048* (2013.01); *G01N 27/227* (2013.01);
(Continued)

(58) Field of Classification Search
CPC .. G01N 27/223; G01N 27/225; G01N 27/048; G01N 27/227; G01N 27/06; G01N 2201/00; H01L 21/311; H01L 28/60
(Continued)

(56) References Cited

U.S. PATENT DOCUMENTS 4,564,882 A * 1/1986 Baxter ................. G01N 27/225
73/335.04
5,075,816 A * 12/1991 Stormbom ........... G01N 27/225
73/335.04
(Continued)

FOREIGN PATENT DOCUMENTS

JP   H01-250850   10/1989
JP   H01-277746   11/1989
(Continued)

OTHER PUBLICATIONS

Harrison ("An Introduction to Depletion-mode MOSFETs"; Pub Date Aug. 7, 2006; Planet Analog weblog; <URL:https://www.planetanalog.com/an-introduction-to-depletion-to-depletion-mode-mosfets-2/?site=planetanalog#>; Also downloadable with images from <URL:https://www.aldinc.com/pdf/IntroDepletionModeMOSFET.pdf> (Year: 2006).*

(Continued)

*Primary Examiner* — Judy Nguyen
*Assistant Examiner* — Rahul Maini
(74) *Attorney, Agent, or Firm* — IPUSA, PLLC

(57) ABSTRACT

A humidity sensor includes a lower electrode formed above a substrate, a first humidity sensing film covering the lower electrode, an upper electrode formed above the first humidity sensing film, and a second humidity sensing film covering the upper electrode and making contact with the first humidity sensing film through openings of the upper electrode. The upper electrode has a predetermined opening pattern. The area of the upper electrode is larger than the area of the lower electrode, and is smaller than the area of the first humidity sensing film.

11 Claims, 18 Drawing Sheets

(51) Int. Cl.
  *H01L 21/311* (2006.01)
  *H01L 49/02* (2006.01)

(52) U.S. Cl.
  CPC ............ *H01L 21/311* (2013.01); *H01L 28/60* (2013.01); *G01N 2201/00* (2013.01)

(58) Field of Classification Search
  USPC ................. 324/658, 664–670, 689, 694–696
  See application file for complete search history.

(56) References Cited

U.S. PATENT DOCUMENTS

| | | |
|---|---|---|
| 2008/0316673 A1 | 12/2008 | Hoofman et al. |
| 2013/0207673 A1 | 8/2013 | Tondokoro et al. |
| 2015/0047430 A1 | 2/2015 | Benzel |
| 2016/0084811 A1* | 3/2016 | Viitanen ............... G01N 27/223 436/93 |

FOREIGN PATENT DOCUMENTS

| | | | | |
|---|---|---|---|---|
| JP | H02-010146 | | 1/1990 | |
| JP | H03-087642 | | 4/1991 | |
| JP | H04-276544 | | 10/1992 | |
| JP | 2546340 | B2 * | 10/1996 | ............ G01N 27/00 |
| JP | 09196878 | A * | 7/1997 | ............ G01N 27/12 |
| JP | 2000150892 | A * | 5/2000 | ........... H01L 29/786 |
| JP | 2009-516192 | | 4/2009 | |
| JP | 2014-062885 | | 4/2014 | |
| JP | 2014062885 | A * | 4/2014 | ........ H01L 23/3107 |
| JP | 5547296 | | 7/2014 | |
| JP | 5547296 | B2 * | 7/2014 | ........... G01N 27/223 |

OTHER PUBLICATIONS

International Search Report for PCT/JP2018/007053 dated May 15, 2018.
Japanese Office Action dated Jun. 30, 2020 (JP Patent Application No. 2017-071469).

* cited by examiner

HUMIDITY SENSOR

TECHNICAL FIELD

The present invention relates to a humidity sensor.

BACKGROUND ART

Various sensors such as humidity sensors, temperature sensors, gas sensors, and electrostatic-capacitance-type touch sensors are used in a variety of products in industrial and personal applications. In general, the operation of a sensor is affected when water drops adhere to the surface of the sensor. Thus, protective measures are taken against dew condensation and water drops.

For example, in a parallel-plate-type humidity sensor having a humidity sensing film sandwiched between a lower electrode and an upper electrode, a structure in which the upper electrode is covered by a protective film is known (see Patent Document 1, for example). According to this document, the protective film and the upper electrode have openings through which the humidity sensing film is exposed to the outside. In the openings, the humidity sensing film is provided so as to reach at least a position higher than the position of the lower surface of the protective film.

CITATION LIST

[Patent Document]
Patent Document 1: Japanese Patent No. 5547296

SUMMARY OF THE INVENTION

Problem to be Solved by the Invention

In the parallel-plate-type humidity sensor having the humidity sensing film sandwiched between the upper electrode and the lower electrode, if water drops contact an electric field leaking from an opening formed in the upper electrode, the state of electric lines of force changes, thus causing an electrostatic capacitance between the upper electrode and the lower electrode to change. Therefore, an accurate humidity measurement value cannot be obtained. In addition, even after water drops adhering to the surface of the humidity sensor are dried, salts and impurity components in the water drops remain as residues. As a result, properties of the humidity sensing film change, and a stable sensor output cannot be obtained.

In view of the above, it is an object of the present invention to provide a humidity sensor that can output stable and accurate measurement values by reducing the influence of water drops on the humidity sensor.

Means to Solve the Problem

In order to achieve the above-described object, a humidity sensor (10A, 10B) according to the present invention includes a lower electrode (13) formed above a substrate (11), a first humidity sensing film (15) covering the lower electrode (13), an upper electrode (17) formed above the first humidity sensing film (15), and a second humidity sensing film covering the upper electrode (17) and making contact with the first humidity sensing film (15) through openings (17a) of the upper electrode (17). The upper electrode (17) has a predetermined opening pattern. The area of the upper electrode (17) is larger than the area of the lower electrode (13), and is smaller than the area of the first humidity sensing (15).

The above reference numerals in brackets are added to facilitate understanding and are merely examples, and the present invention is not limited to illustrated embodiments.
Effects of the Invention According to a humidity sensor disclosed herein, it is possible to output stable and accurate measurement values by reducing the influence of water drops on the humidity sensor.

MODE FOR CARRYING OUT THE INVENTION

Figure 1:
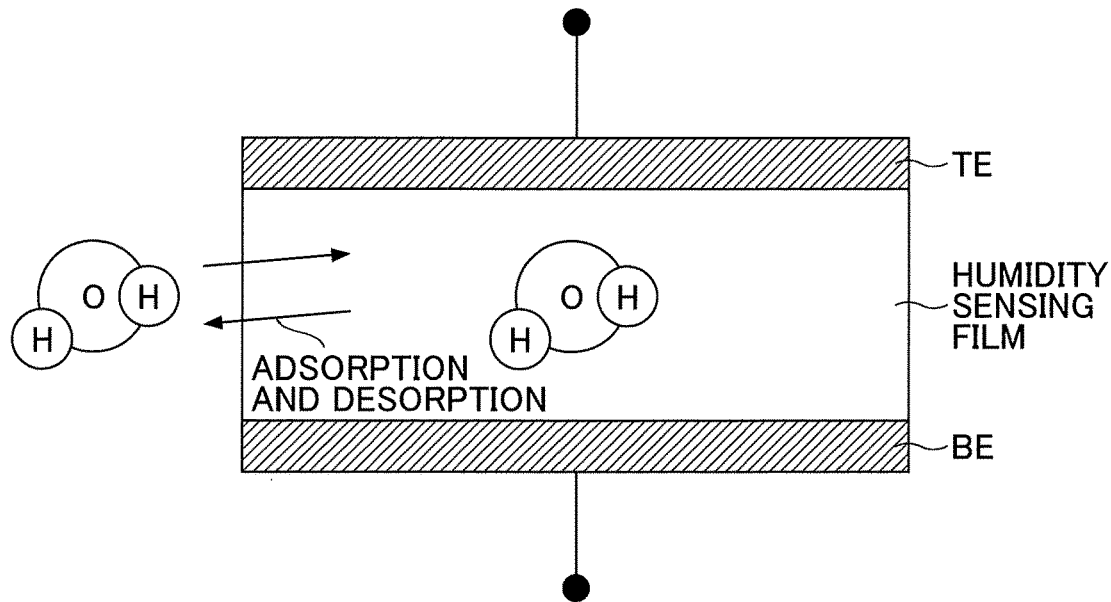
FIG. 1 is a diagram (1) illustrating the principle of a humidity sensor.

In the following, embodiments of the present invention will be described with reference to the accompanying drawings. In the drawings, the same elements are denoted by the same reference numerals, and a duplicate description thereof may be omitted.

Figure 2:
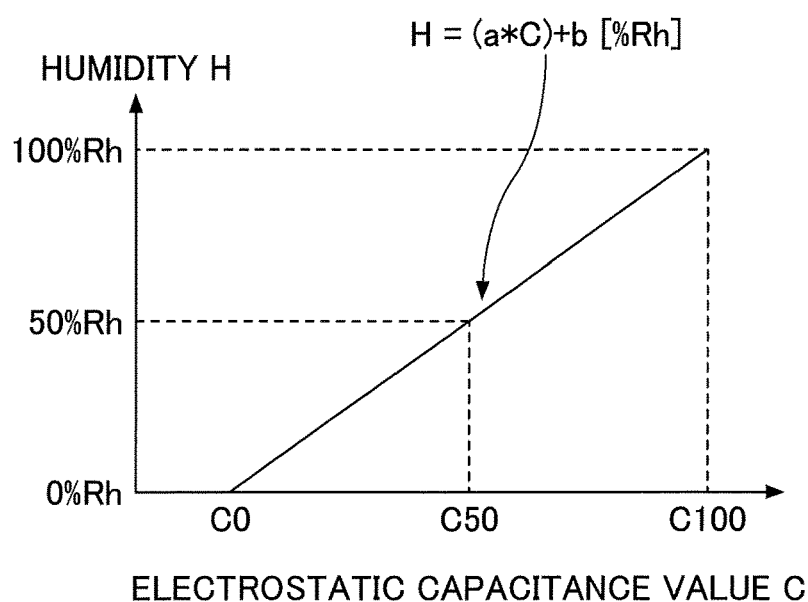
FIG. 2 is a diagram (2) illustrating the principle of the humidity sensor.

First, the principle of a humidity sensor will be described. FIG. 1 and FIG. 2 are diagrams illustrating the principle of a humidity sensor.

As illustrated in FIG. 1, a parallel-plate-type humidity sensor has a structure in which a humidity sensing film is sandwiched between a lower electrode (BE) and an upper electrode (TE). Depending on humidity, the number of water molecules adsorbed to the humidity sensing film differs, and the dielectric constant of the humidity sensing film changes. A difference between relative dielectric constants of the humidity sensing film and water is utilized to detect a change in an electrostatic capacitance value.

As illustrated in FIG. 2, changes in an electrostatic capacitance value C in accordance with changes in a relative humidity (Rh) between 0% and 100% are measured. The electrostatic capacitance value C is measured at a plurality of known relative humidities to obtain an approximate expression. In the example illustrated in FIG. 2, a humidity H is linearly approximated by H=a*C+b. A gradient a and an intercept b may be used as correction constants to convert the measured electrostatic capacitance value into the relative humidity.

In the parallel-plate-type humidity sensor, in order to increase responsiveness by effectively adsorbing moisture in the air to the humidity sensing film, an opening pattern may be formed in the upper electrode (TE). In this case, an electric field leaks into the air from openings of the upper electrode (TE). As described above, if dew condensation or water drops come into contact with the leaked electric field, the state of electric lines of force change, and an electrostatic capacitance between the upper electrode (TE) and the lower electrode (BE) increases. As a result, the original approximate expression (correction constants) can no longer be used, and the function of the humidity sensor would deteriorate.

In light of the above, in the following embodiments of the present invention, a parallel-plate-type humidity sensor employs a structure in which a first humidity sensing film formed between an upper electrode and a lower electrode and a second humidity sensing film covering the upper electrode are stacked. The parallel-plate-type humidity sensor further employs a structure in which the area of the upper electrode is larger than the area of the lower electrode, and is also smaller than the area of the first humidity sensing film. Accordingly, it is possible to output stable and accurate measurement values by reducing the influence of water drops on the humidity sensor.

FIRST EMBODIMENT

Figure 3:
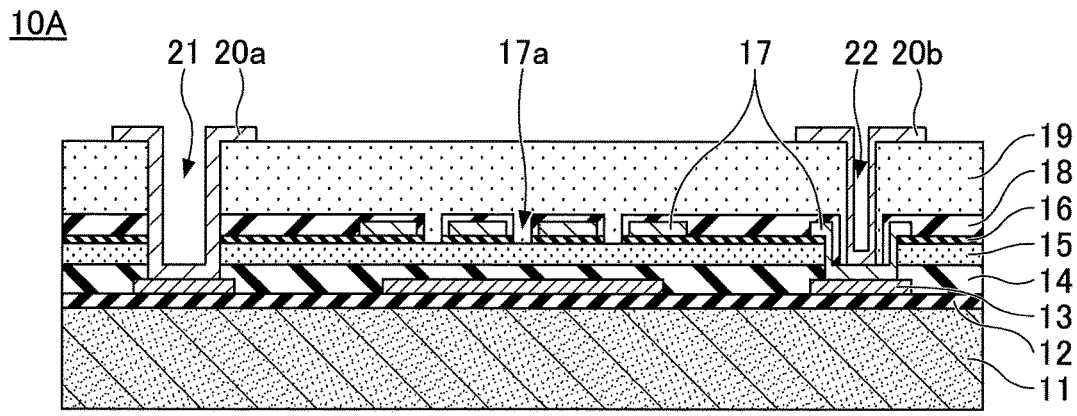
FIG. 3 is a schematic cross-sectional view illustrating a humidity sensor according to a first embodiment.

A humidity sensor according to a first embodiment will be described. FIG. 3 is a schematic cross-sectional view illustrating the humidity sensor according to the first embodiment.

As illustrated in FIG. 3, a humidity sensor 10A has a structure in which an insulating film 12, a lower electrode 13, a protective film 14, a first humidity sensing film 15, a protective film 16, an upper electrode 17, a protective film 18, a second humidity sensing film 19, and electrode pads 20a and 20b are stacked on a substrate 11.

The substrate 11 may be a semiconductor substrate such as a silicon substrate, or may be an insulating substrate.

The insulating film 12 is formed on the substrate 11. The insulating film 12 may be a silicon oxide ($SiO_2$) film, a silicon nitride (SiN) film, or may be a laminated film thereof. If an insulating substrate is used as the substrate 11, the insulating film 12 is not required to be formed.

The lower electrode 13 is formed on the insulating film 12. The lower electrode 13 is formed in a predetermined pattern. The lower electrode 13 may be aluminium (Al), Al—Si, or Al—Si—Cu, or may be a noble metal such as gold (Au) or platinum (Pt). Further, nickel (Ni) may be formed as a base film.

The protective film 14 is formed so as to cover the lower electrode 13. For example, the protective film 14 may be a $SiO_2$ film, a SiN film, or a laminated film thereof. The protective film 14 is not necessarily required; however, in order to protect the lower electrode 13 from corrosion, it is preferable to form the protective film 14 so as to cover the lower electrode 13. If a noble metal such as Au or Pt is used as the lower electrode 13, the protective film 14 is not required to be formed.

The first humidity sensing film 15 is formed between the lower electrode 13 and the upper electrode 17. The first humidity sensing film 15 is formed of a polymer material such as polyimide (PI), cellulose, polymethyl methacrylate (PMMA), or polyvinyl alcohol (PVA) that readily adsorbs water molecules. In order to prevent a short circuit, the thickness of the first humidity sensing film 15 is preferably 0.5 μm or more. In addition, from the viewpoint of responsiveness or sensitivity, the thickness of the first humidity sensing film 15 is preferably 1.5 μm or less. Namely, the thickness of the first humidity sensing film 15 is preferably 0.5 μm to 1.5 μm.

The upper electrode 17 is formed above the first humidity sensing film 15. The upper electrode 17 is formed in a predetermined pattern such that the area of the upper electrode 17 is larger than the area of the lower electrode 13. For example, the upper electrode 17 may be formed of the same material as the lower electrode 13. The upper electrode 17 has predetermined openings 17a, and the first humidity sensing film 15 and the second humidity sensing film 19 make contact with each other through the openings 17a. The size of the openings 17a may be set to an optimum design value by taking properties and processes into consideration. Preferably, the size of the openings 17a is as small as possible. This is because as the size of the openings 17a decreases, a leaked electric field can be more effectively confined.

The protective films 16 and 18 are formed so as to cover the entire area of the upper electrode 17. Accordingly, water resistance improves. The protective films 16 and 18 may be $SiO_2$ films, SiN films, or laminated films thereof. The protective films 16 and 18 are not necessarily required; however, in order to protect the upper electrode 17 from corrosion, it is preferable to form the protective films 16 and 18 so as to cover the upper electrode 17. If a noble metal such as Au or Pt is used as the upper electrode 17, the protective films 16 and 18 are not required to be formed.

The second humidity sensing film 19 is formed so as to cover the upper electrode 17, and makes contact with the first humidity sensing film 15 through the openings 17a of the upper electrode 17. With this configuration, when an electric field leaks from the openings 17a of the upper electrode 17, it is possible to prevent water drops from contacting the leaked electric field. The second humidity sensing film 19 may be formed of the same material as the first humidity sensing film 15, or may be formed of a different material from the first humidity sensing film 15. From the viewpoint of humidity sensitive properties, the second humidity sensing film 19 is preferably formed of the same material as the first humidity sensing film 15. In order to effectively prevent water drops from contacting the leaked electric field, the thickness of the second humidity sensing film 19 is preferably larger than the thickness of the first humidity sensing film 15. Further, in order to quickly adsorb water molecules to the first humidity sensing film 15, the thickness of the second humidity sensing film 19 is preferably equal to or less than 10 times the thickness of the first humidity sensing film 15. Specifically, the thickness of the second humidity sensing film 19 is preferably 1 to 10 times the thickness of the first humidity sensing film 15.

The electrode pads 20a and 20b are pads for wire bonding. The electrode pad 20a is formed at an electrode extraction opening 21 that reaches the lower electrode 13. The electrode pad 20b is formed at an electrode extraction opening 22 that reaches the upper electrode 17. With this configuration, the electrode pads 20a and 20b are electrically connected to the lower electrode 13 and the upper electrode 17, respectively. The opening and the opening 22 may each have a size of approximately 40 μm to 120 μm. A predetermined voltage is applied between the lower electrode 13 and the upper electrode 17 through the electrode pads 20a and 20b, an electrostatic capacitance value C is measured, and a relative humidity is calculated by using a preliminarily obtained approximate expression (correction constants). According to the structure of FIG. 3, the upper electrode 17 has an effect of confining a leaked electric field, and the second humidity sensing film 19 protects a main part of the sensor from adhesion of water molecules. Thus, the measured electrostatic capacitance value can be accurately converted into the relative humidity.

Figure 4:
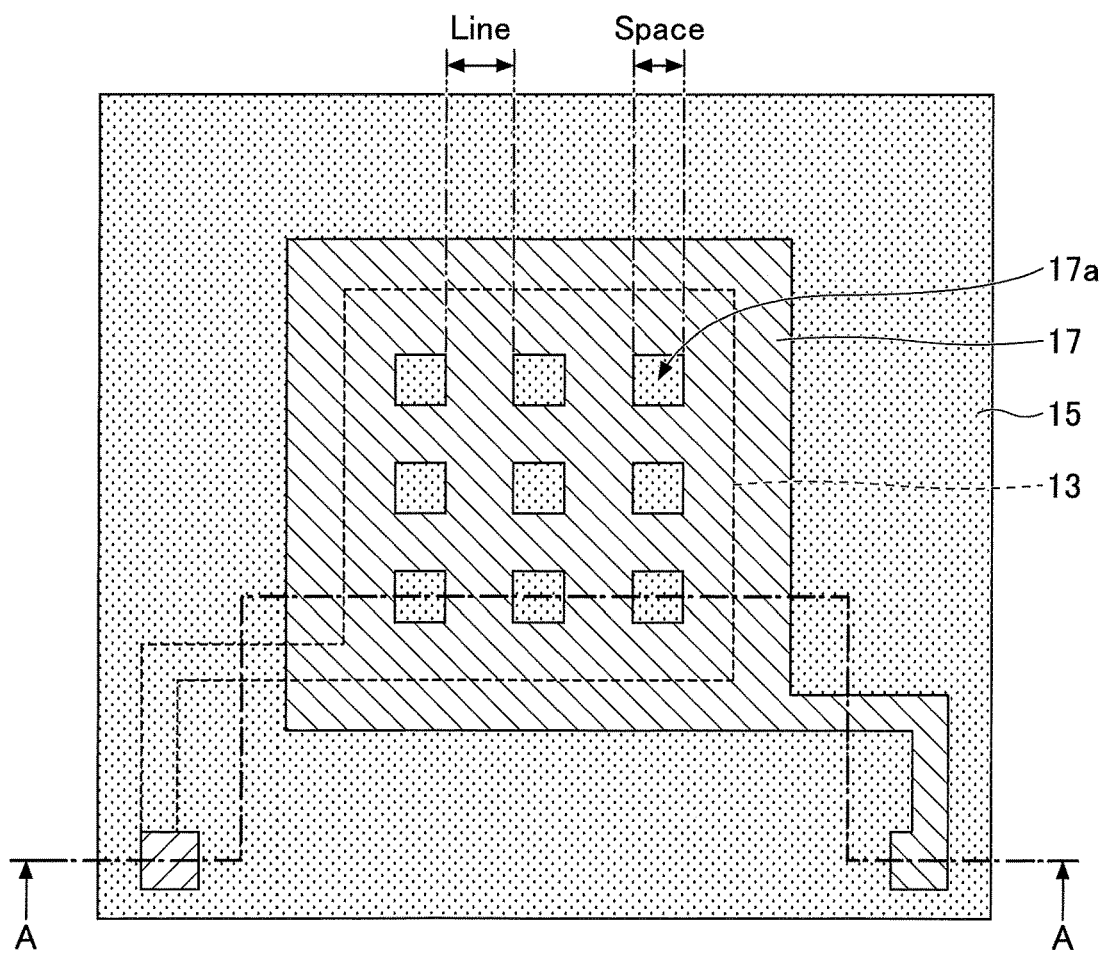
FIG. 4 is a diagram illustrating an example of an electrode pattern of the humidity sensor according to the first embodiment.

FIG. 4 is a diagram illustrating an example of an electrode pattern of the humidity sensor 10A according to the first embodiment. For the sake of convenience, only the lower electrode 13, the first humidity sensing film 15, and the upper electrode 17 are illustrated in FIG. 4, and the other elements are not depicted.

The pattern of the upper electrode 17 illustrated in FIG. 4 is a lattice-like pattern formed above the first humidity sensing film 15 above the lower electrode 13, and has the openings 17a. In FIG. 4, although the second humidity sensing film 19 is not depicted for the sake of convenience, the second humidity sensing film 19 is formed over the upper electrode 17. Thus, it is possible to minimize the contact of water drops with an electric field leaking from the openings 17a. At the same time, water molecules in the air can be adsorbed from the openings 17a to the first humidity sensing film 15 via the shortest path. A line-and-space (L/S) pattern, defining the lattice-like electrode pattern, may be varied by 1 μm/1 μm, 2 μm/2 μm, 5 μm/5 μm, and 10 μm/10 μm, for example.

Further, the area of the upper electrode 17 is larger than the area of the lower electrode 13, and is smaller than the area of the first humidity sensing film 15. Accordingly, the influence of water drops on the humidity sensor can be reduced, and also a stable and accurate measurement value can be output. Details will be described below with reference to examples. The area of the lower electrode 13 refers to an area where an extraction wiring portion is not included, and the area of upper electrode 17 refers to an area where an extraction wiring portion is not included. The cross section of the humidity sensor 10A illustrated in FIG. 3 described above is taken through a long-dash short-dash line A-A of FIG. 4.

Figure 5:
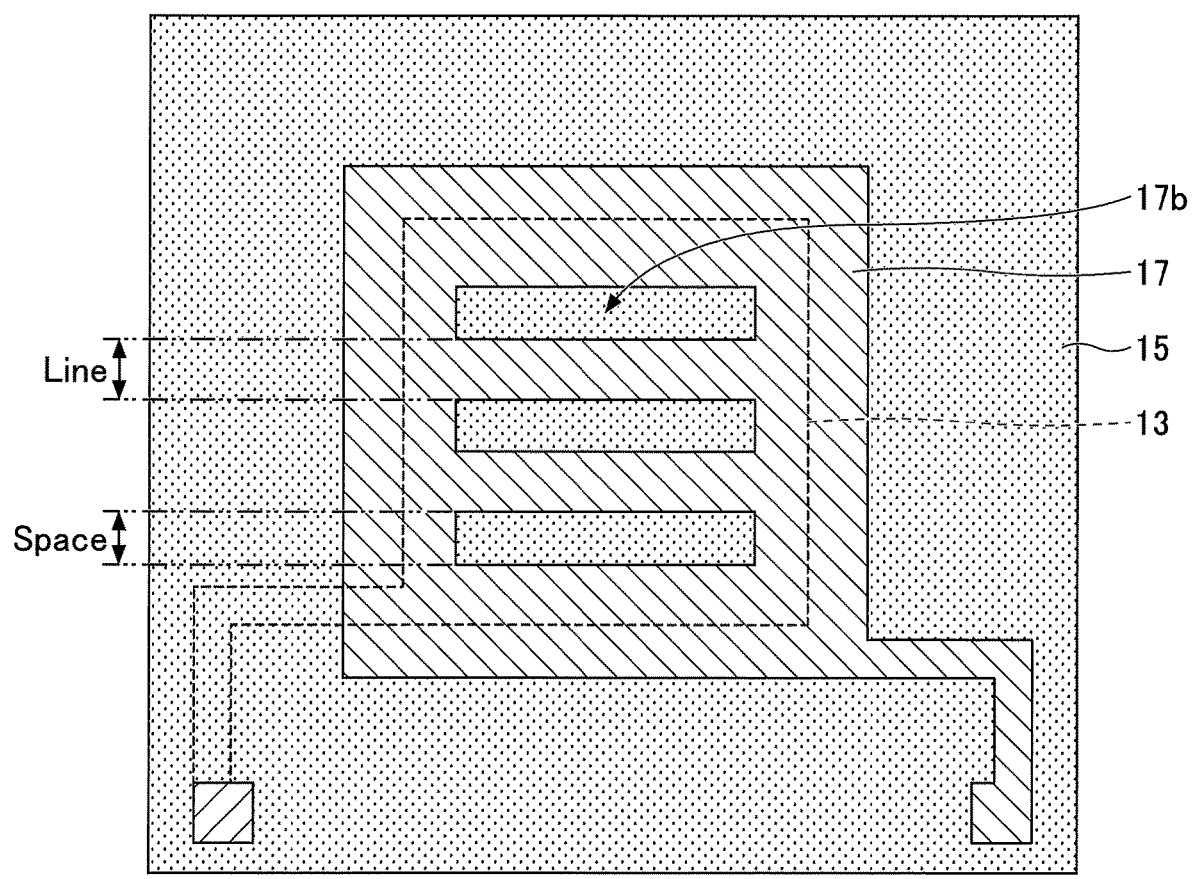
FIG. 5 is a diagram illustrating an example of another electrode pattern of the humidity sensor according to the first embodiment.

FIG. 5 is a diagram illustrating an example of another electrode pattern of the humidity sensor according to the first embodiment. For the sake of convenience, only the lower electrode 13, the first humidity sensing film 15, and the upper electrode 17 are illustrated in FIG. 5, and the other elements are not depicted.

The pattern of the upper electrode 17 illustrated in FIG. 5 is a ladder-like pattern formed above the first humidity sensing film 15 above the lower electrode 13, and has openings 17b extending in one direction. In FIG. 5, although the second humidity sensing film 19 is not depicted for the sake of convenience, the second humidity sensing film 19 is formed over the upper electrode 17. Thus, it is possible to minimize the contact of water drops with an electric field leaking from the openings 17a. At the same time, water molecules in the air can be adsorbed from the openings 17b to the first humidity sensing film 15 via the shortest path. A line-and-space (L/S) pattern, defining the ladder-like electrode pattern, may be varied by 1 μm/1 μm, 2 μm/2 μm, 5 μm/5 μm, and 10 μm/10 μm, for example.

Further, the area of the upper electrode 17 is larger than the area of the lower electrode 13, and is smaller than the area of the first humidity sensing film 15. Accordingly, the influence of water drops on the humidity sensor can be minimized, and a stable and accurate measurement value can be output. Details will be described below with reference to the examples Next, a method for manufacturing the humidity sensor 10A of FIG. 3 and FIG. 4 will be described. FIG. 6A through FIG. 6D, FIG. 7A through FIG. 7D, and FIG. 8A through FIG. 8C are cross-sectional views illustrating processes for manufacturing the humidity sensor 10A.

Figure 6A:
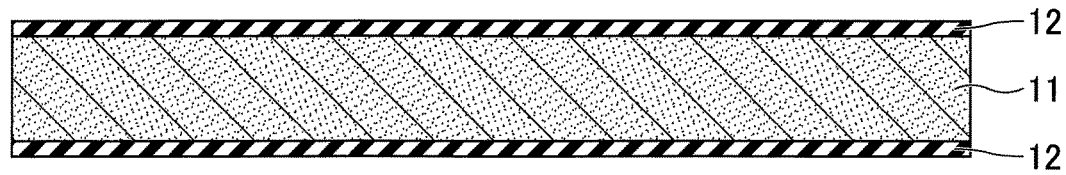
FIG. 6A is a cross-sectional view illustrating a process (1) for manufacturing the humidity sensor according to the first embodiment.

First, as illustrated in FIG. 6A, the insulating film 12 is formed on both the upper surface and the lower surface of the substrate 11. Specifically, a SiO$_2$ film having a thickness of 0.5 μm to 5 μm is formed on both the upper surface and the lower surface of a p-type silicon substrate by thermal oxidation. Note that the insulating film 12 may be formed only on the upper surface of the substrate 11 by, for example, sputtering. The upper surface of the substrate 11 refers to a surface (an upper-side surface in the figures) on which the films are stacked.

Figure 6B:
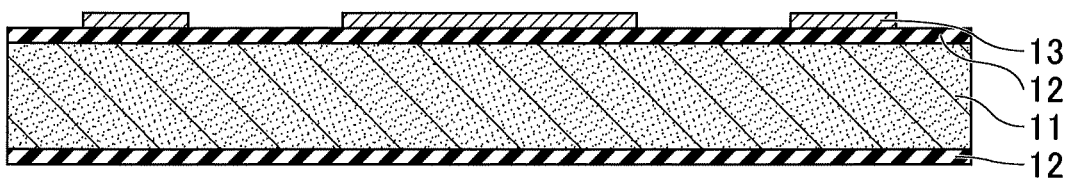
FIG. 6B is a cross-sectional view illustrating the process (1) for manufacturing the humidity sensor according to the first embodiment.

Next, as illustrated in FIG. 6B, the lower electrode 13 is formed on the insulating film 12. Specifically, an electrode material such as Al, Al—Si, Al—Si—Cu, Au, or Pt having, for example, a thickness of 0.2 μm is formed on the SiO$_2$ film, and patterned into a desired pattern by photolithography.

Figure 6C:
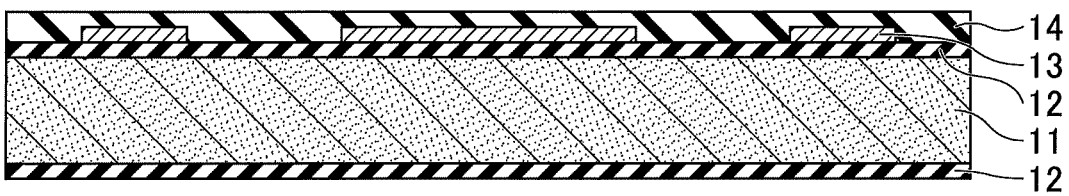
FIG. 6C is a cross-sectional view illustrating the process (1) for manufacturing the humidity sensor according to the first embodiment.

Next, as illustrated in FIG. 6C, the protective film 14 is formed so as to cover the lower electrode 13. Specifically, an insulating film such as a SiO$_2$ film, a SiN film, or a laminated film thereof is formed so as to cover the lower electrode 13. Note that if a noble metal such as Au or Pt is used as the electrode material of the lower electrode 13, the protective film 14 is not required to be formed.

Figure 6D:
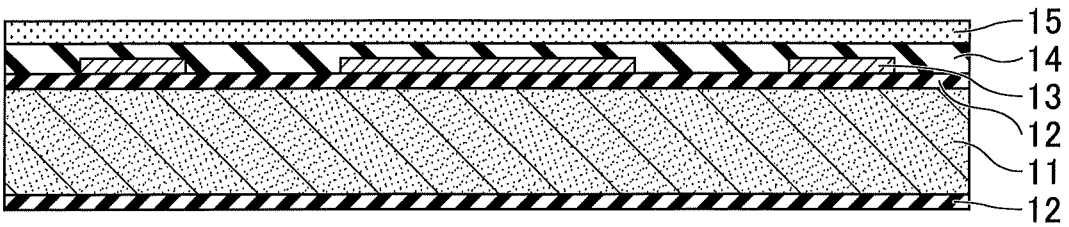
FIG. 6D is a cross-sectional view illustrating the process (1) for manufacturing the humidity sensor according to the first embodiment.

Next, as illustrated in FIG. 6D, the first humidity sensing film 15 is formed on the protective film 14. Specifically, a polymer material such as PI, cellulose, PMMA, or PVA that readily adsorbs water molecules is coated onto the protective film to a thickness of 0.5 μm to 1.5 μm by spin coating, dip coating, or a coater.

Figure 7A:
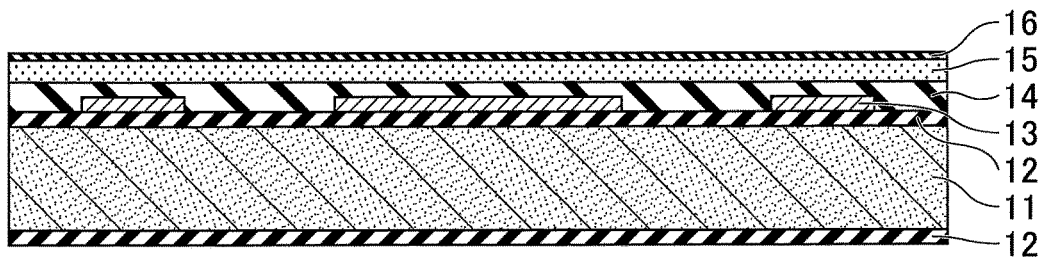
FIG. 7A is a cross-sectional view illustrating a process (2) for manufacturing the humidity sensor according to the first embodiment.

Next, as illustrated in FIG. 7A, the protective film 16 is formed on the first humidity sensing film 15. Specifically, an insulating film such as a SiO$_2$ film, a SiN film, or a laminated film thereof is formed on the first humidity sensing film 15. Note that if a noble metal such as Au or Pt is used as an electrode material of the upper electrode 17, the protective film 16 is not required to be formed.

Figure 7B:
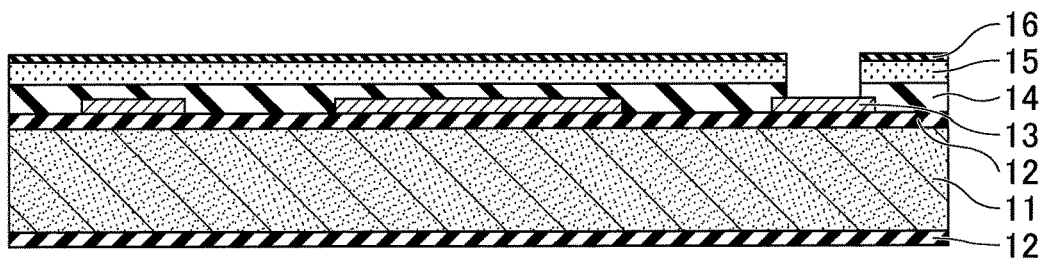
FIG. 7B is a cross-sectional view illustrating the process (2) for manufacturing the humidity sensor according to the first embodiment.

Next, as illustrated in FIG. 7B, a resist mask having an opening at a position the electrode extraction opening is formed, and the protective film 14, the first humidity sensing film 15, and the protective film 16 are partially removed by reactive-ion etching (RIE). As a result, a part of the lower electrode 13 is exposed at a predetermined position.

Figure 7C:
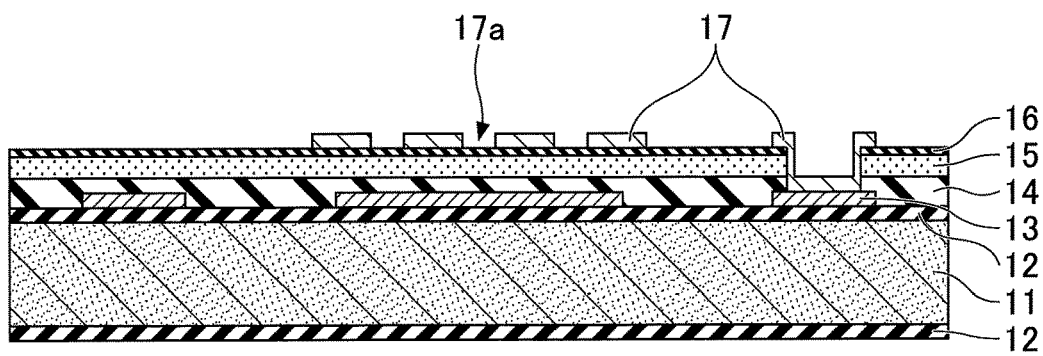
FIG. 7C is a cross-sectional view illustrating the process (2) for manufacturing the humidity sensor according to the first embodiment.

Next, as illustrated in FIG. 7C, the upper electrode 17 is formed on the protective film 16. Specifically, an electrode material such as Al, Al—Si, Al—Si—Cu, Au, or Pt having, for example, a thickness of 0.2 μm is formed on the protective film 16, and patterned into a desired pattern by photolithography. At this time, the electrode material is patterned such that the area of the upper electrode 17 is larger than the area of the lower electrode 13, and is smaller than the area of the first humidity sensing film 15. Note that in order to improve adherence, a pretreatment (such as a plasma surface modification treatment) may be applied before the upper electrode 17 is formed.

Figure 7D:
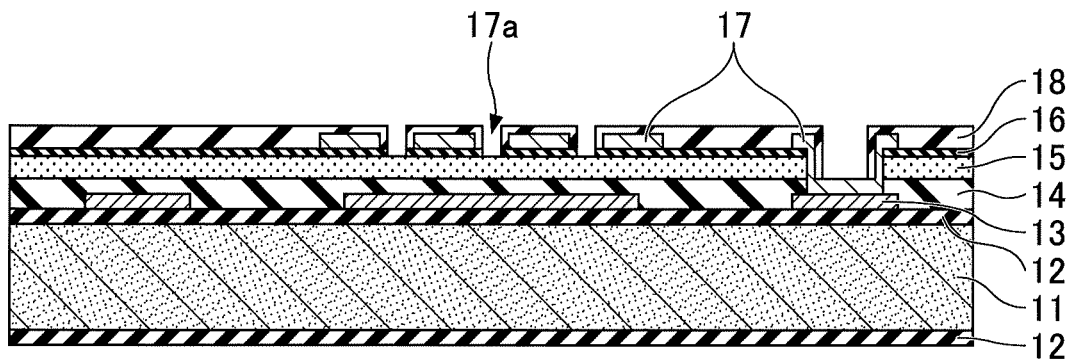
FIG. 7D is a cross-sectional view illustrating the process (2) for manufacturing the humidity sensor according to the first embodiment.

Next, as illustrated in FIG. 7D, the protective film 18 is formed so as to cover the upper electrode 17. Specifically, an insulating film such as a SiO$_2$ film, a SiN film, or a laminated film thereof is formed so as to cover the upper electrode 17. Subsequently, a resist mask having openings at positions corresponding to the openings 17a and the electrode extraction opening is formed, and the protective films 16 and 18 are partially removed by RIE. As a result, the first humidity sensing film 15 and the upper electrode 17 are partially exposed at predetermined positions. Note that if a noble metal such as Au or Pt is used as the electrode material of the upper electrode 17, the protective film 18 is not required to be formed.

Figure 8A:
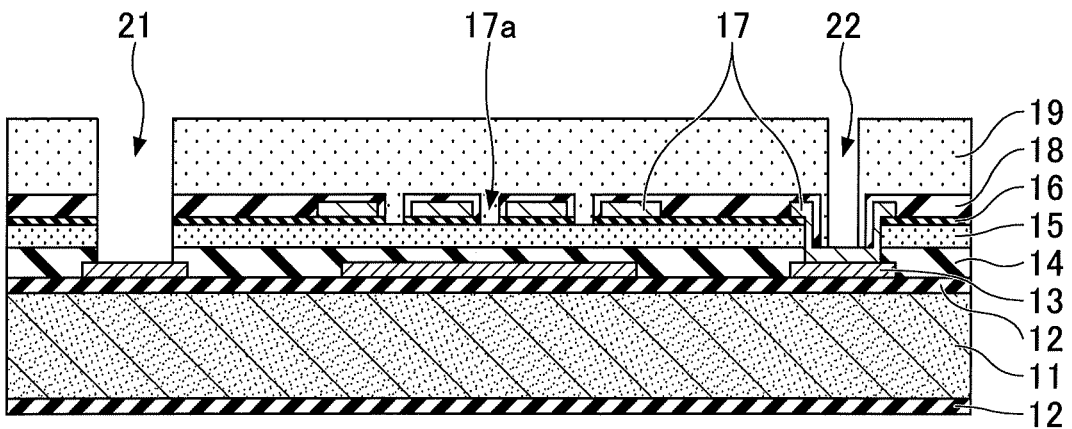
FIG. 8A is a cross-sectional view illustrating a process (3) for manufacturing the humidity sensor according to the first embodiment.

Next, as illustrated in FIG. 8A, the second humidity sensing film 19 is formed so as to cover the upper electrode 17. Specifically, a polymer material such as PI, cellulose, PMMA, or PVA that readily adsorbs water molecules is coated onto the protective film 18 to a thickness of 0.5 μm to 10 μm by spin coating, dip coating, or a coater. At this time, the openings 17a of the upper electrode 17 are filled with the second humidity sensing film 19. Subsequently, a resist mask having openings at positions corresponding to the electrode extraction openings is formed, the second humidity sensing film 19 is partially removed by RIE, and the lower electrode 13 and the upper electrode 17 are partially exposed at predetermined positions. As a result, the electrode extraction opening 21 that reaches the lower electrode 13 and the electrode extraction opening 22 that reaches the upper electrode 17 are formed.

Figure 8B:
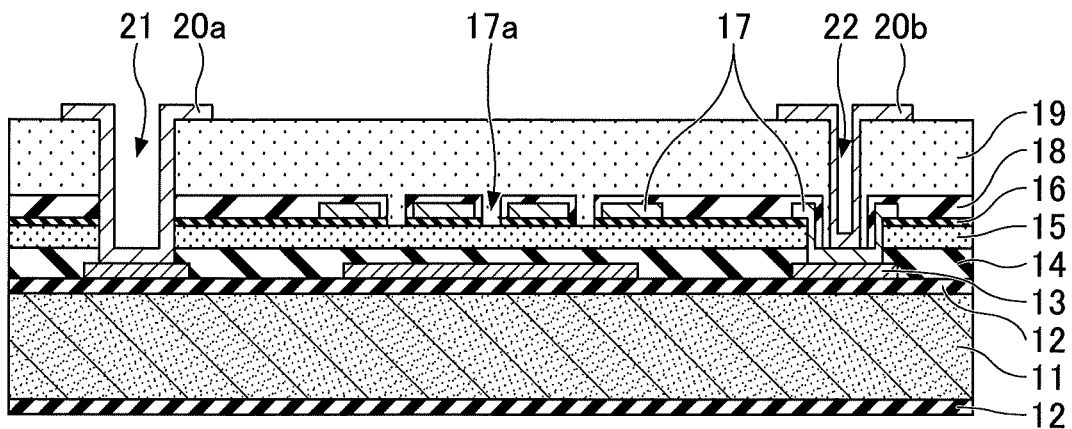
FIG. 8B is a cross-sectional view illustrating a process (3) for manufacturing the humidity sensor according to the first embodiment.

Next, as illustrated in FIG. 8B, the electrode pads 20a and 20b are respectively formed at the opening 21 and the opening 22. Specifically, metal films having a thickness of 0.5 μm to 0.6 μm are formed at the opening 21 and the opening 22 by lift-off.

Figure 8C:
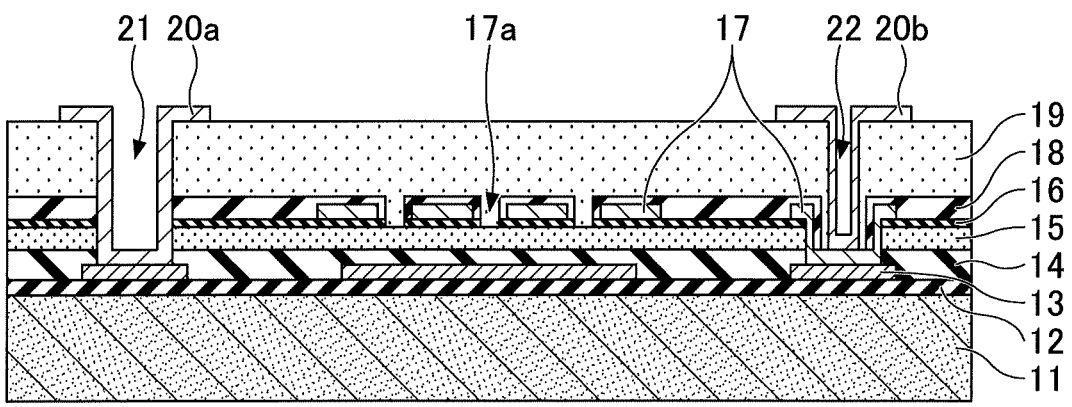
FIG. 8C is a cross-sectional view illustrating a process (3) for manufacturing the humidity sensor according to the first embodiment.

Next, as illustrated in FIG. 8C, backgrinding is performed (the lower surface is ground). Specifically, by grinding the SiO$_2$ film formed on the lower surface of the p-type silicon substrate and grinding the p-type silicon substrate, the p-type silicon substrate can be reduced to a desired thickness.

With the above-described processes, the humidity sensor 10A illustrated in FIG. 3 and FIG. 4 can be manufactured. The humidity sensor having the electrode pattern illustrated in FIG. 5 can be manufactured by a method similar to the above-described method.

Figure 9:
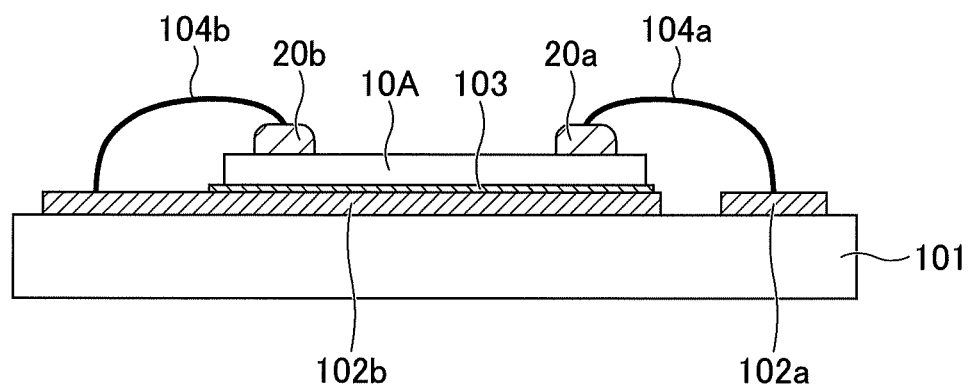
FIG. 9 is a diagram illustrating the humidity sensor mounted on a mounting substrate.

Next, a structure in which the humidity sensor 10A according to the first embodiment is mounted on a mounting substrate will be described. FIG. 9 is a diagram illustrating the humidity sensor 10A mounted on the mounting substrate.

As illustrated in FIG. 9, the humidity sensor 10A is attached to a wiring pattern 102b through a conductive adhesive 103 such as silver paste by die bonding. The wiring pattern 102b is formed on a mounting substrate 101. With this configuration, the substrate 11 of the humidity sensor 10A is electrically connected to the wiring pattern 102b. The upper electrode 17 of the humidity sensor 10A is electrically connected to the wiring pattern 102b via the electrode pad 20b and a bonding wire 104b. Namely, the upper electrode 17 is electrically connected to the substrate 11 via the bonding wire 104b and the wiring pattern 102b provided outside the humidity sensor 10A. Accordingly, the electric potential of the upper electrode 17 becomes equal to the electric potential of the substrate 11. As a result, it becomes possible to confine an electric field inside the first humidity sensing film 15, and reduce water and dust adhering to the humidity sensor 10A. Further, the lower electrode 13 is electrically connected to a wiring pattern 102a via the electrode pad 20a and a bonding wire 104a.

In the example of FIG. 9, the upper electrode 17 is electrically connected to the substrate 11 via the bonding wire 104b and the wiring pattern 102b; however, the method for electrically connecting the upper electrode 17 and the substrate 11 is not limited thereto. For example, at the time of mounting, an extraction wire may be formed on the mounting substrate 101 in order to enable electrical connection to the substrate 11, and the upper electrode 17 may be electrically connected to the substrate 11 on a final integration substrate.

Next, a structure in which the humidity sensor 10A mounted on the mounting substrate is sealed by a resin will be described.

Figure 10:
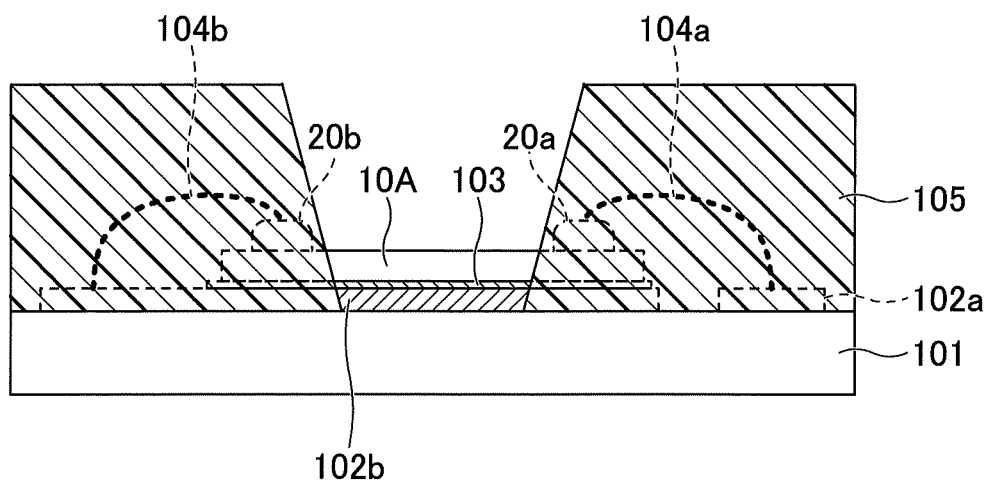
FIG. 10 is a diagram (1) illustrating the humidity sensor mounted on the mounting substrate.

FIG. 10 is a diagram illustrating the humidity sensor 10A mounted on the mounting substrate. In the structure illustrated in FIG. 10, the electrode pads 20a and 20b, the wiring patterns 102a and 102b, and the bonding wires 104a and 104b, which are exposed on the surface of the humidity sensor 10A, are sealed by a resin 105. A part of the humidity sensing portion (the second humidity sensing film 19) of the humidity sensor 10A is not sealed by the resin 105, and is exposed. With this configuration, it is possible to quickly adsorb water molecules to the first humidity sensing film 15 while protecting the electrode pads 20a and 20b, the wiring patterns 102a and 102b, and the bonding wires 104a and 104b from corrosion.

Figure 11:
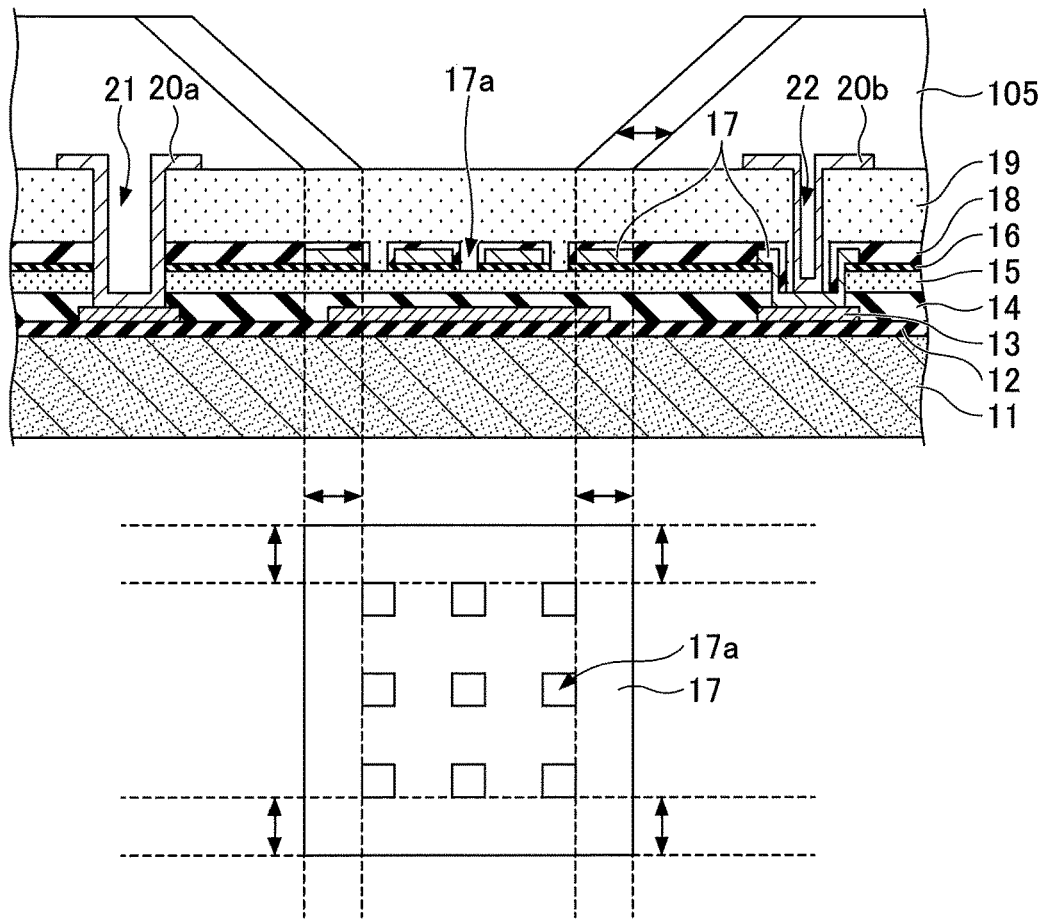
FIG. 11 is a diagram (2) illustrating the humidity sensor mounted on the mounting substrate.

FIG. 11 is a diagram illustrating the humidity sensor 10A mounted on the mounting substrate. In FIG. 11, a positional relationship between the humidity sensor 10A and the resin 105 is illustrated. The upper side of FIG. 11 is a schematic cross-sectional view illustrating the positional relationship between the humidity sensor 10A and the resin 105. The lower side of FIG. 11 is a schematic plan view of the upper electrode 17. As illustrated in FIG. 11, it is preferable to form the resin 105 on the second humidity sensing film 19 so as to extend towards the outer periphery of the humidity sensor 10A from a position between an outermost peripheral opening 17a and the outer peripheral edge of the upper electrode 17 (a range indicated by a two-way arrow). In other words, it is preferable to form the resin 105 in such a manner that all the openings 17a formed in the upper electrode 17 are exposed while the second humidity sensing film 19 is less exposed. As a result, resistance to adhesion of water drops can be particularly improved.

SECOND EMBODIMENT

Figure 12:
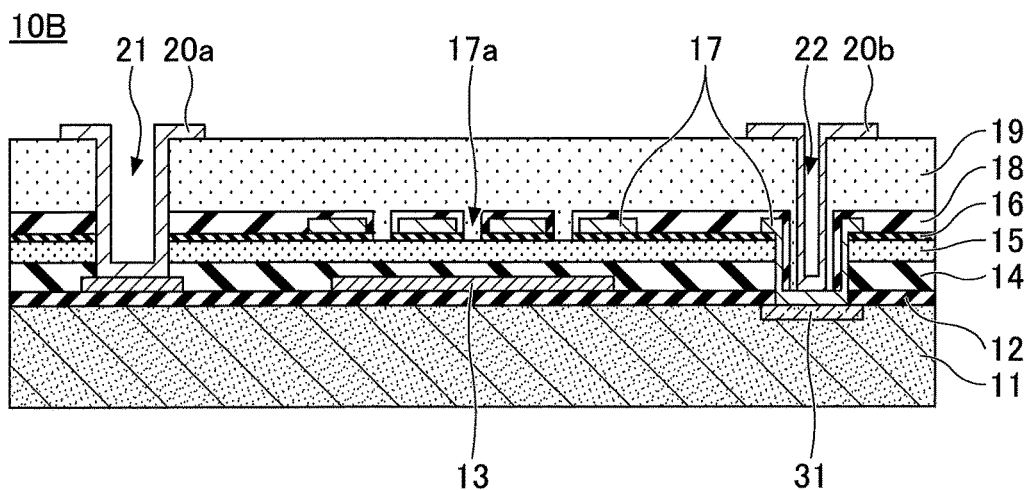
FIG. 12 is a schematic cross-sectional view of a humidity sensor according to a second embodiment.

A humidity sensor according to a second embodiment will be described. FIG. 12 is a schematic cross-sectional view of the humidity sensor according to the second embodiment.

Similar to the humidity sensor 10A according to the first embodiment, a humidity sensor 10B according to the second embodiment includes the first humidity sensing film 15 formed between the lower electrode 13 and the upper electrode 17, and the second humidity sensing film 19 covering the upper electrode 17. Further, the area of the upper electrode 17 is larger than the area of the lower electrode 13, and is smaller than the area of the first humidity sensing film 15. The materials and thicknesses of the first humidity sensing film 15 and of the second humidity sensing film 19 of the humidity sensor 10A are the same as those of the humidity sensor 10A according to the first embodiment. The conductor region of the upper electrode 17 and the pattern of the openings 17a are also the same as those of the humidity sensor 10A according to the first embodiment.

As illustrated in FIG. 12, the humidity sensor 10B differs from the humidity sensor 10A according to the first embodiment in that the upper electrode 17 is electrically connected to the substrate 11 inside the humidity sensor 10B, and the electric potential of the upper electrode 17 is fixed. Specifically, at the position where the opening 22 is formed, the upper electrode 17 is electrically connected to the substrate 11, which is a p-type silicon substrate, via a contact layer 31, which is a P+ layer, formed on the surface of the p-type silicon substrate. Accordingly, the electric potential of the upper electrode 17 is fixed so as to be equal to the electric potential of the substrate 11.

Next, a method for manufacturing the humidity sensor 10B of FIG. 12 will be described. FIG. 13A through FIG. 13E, FIG. 14A through FIG. 14D, and FIG. 15A through FIG. 15C are cross-sectional views illustrating processes for manufacturing the humidity sensor 10B.

Figure 13A:
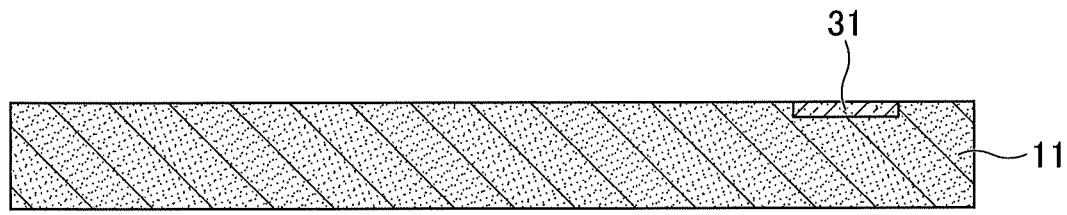
FIG. 13A is a cross-sectional view illustrating a process (1) for manufacturing the humidity sensor according to the second embodiment.

First, as illustrated in FIG. 13A, the contact layer 31 is formed at a position where an electrode extraction opening for the upper electrode 17 is formed. Specifically, the P+ layer is formed by using an ion implantation method to implant boron (B) into the surface of the silicon substrate at the position where the electrode extraction opening for the upper electrode 17 is formed. Further, in order to activate the implanted boron, an annealing treatment may be performed when necessary. Instead of the ion implantation method, a thermal diffusion method may be employed.

Figure 13B:
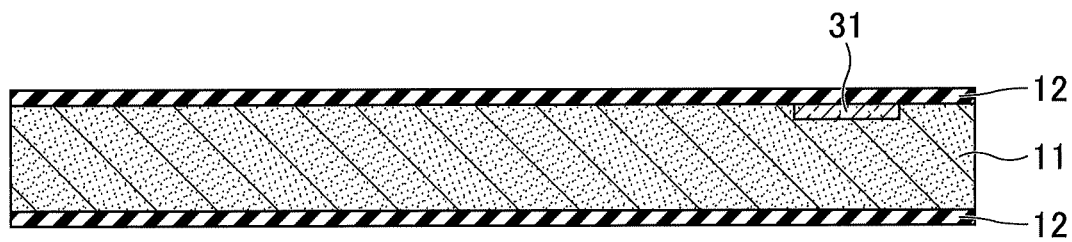
FIG. 13B is a cross-sectional view illustrating the process (1) for manufacturing the humidity sensor according to the second embodiment.

Next, as illustrated in FIG. 13B, the insulating film 12 is formed on both surfaces of the substrate 11.

Figure 13C:
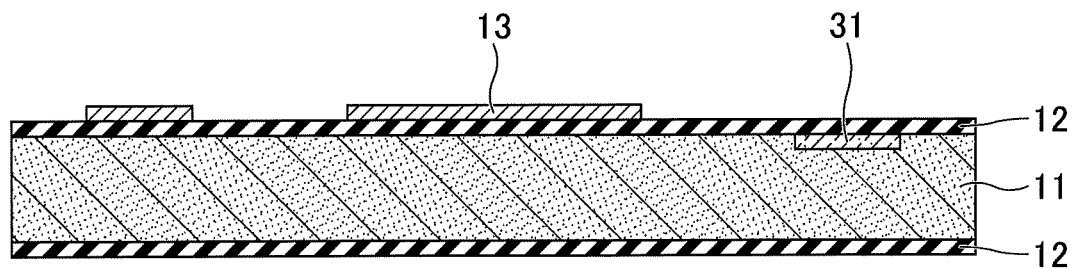
FIG. 13C is a cross-sectional view illustrating the process (1) for manufacturing the humidity sensor according to the second embodiment.

Next, as illustrated in FIG. 13C, the lower electrode 13 is formed on the insulating film 12. At this time, unlike the first embodiment, the lower electrode is not required to be formed at the position where the contact layer 31 is formed.

Figure 13D:
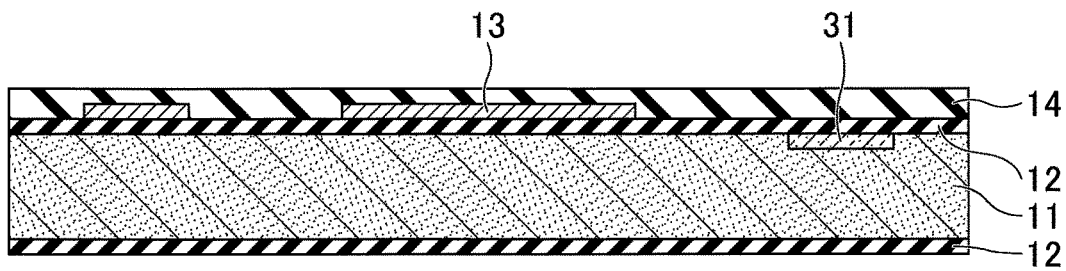
FIG. 13D is a cross-sectional view illustrating the process (1) for manufacturing the humidity sensor according to the second embodiment.

Next, as illustrated in FIG. 13D, similar to the first embodiment, the protective film 14 is formed so as to cover the lower electrode 13.

Figure 13E:
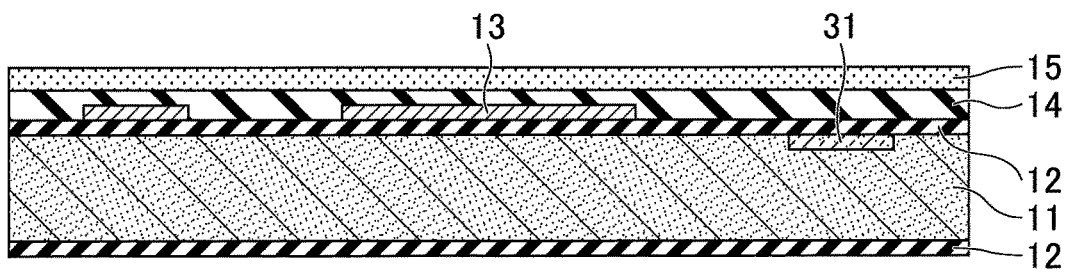
FIG. 13E is a cross-sectional view illustrating the process (1) for manufacturing the humidity sensor according to the second embodiment.

Next, as illustrated in FIG. 13E, similar to the first embodiment, the first humidity sensing film 15 is formed on the protective film 14.

Figure 14A:
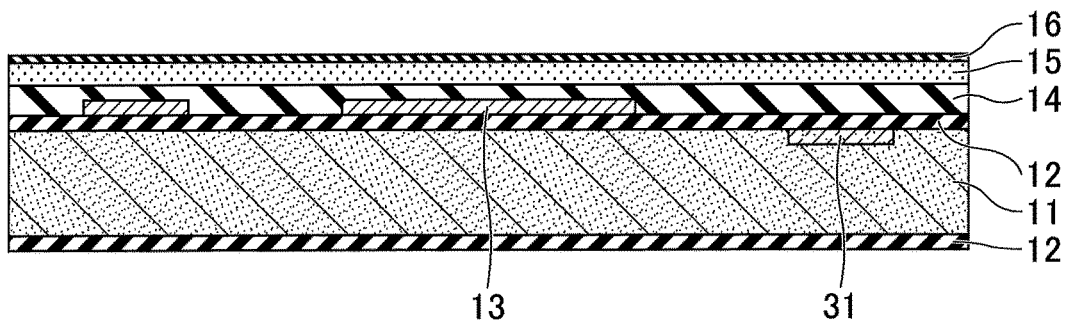
FIG. 14A is a cross-sectional view illustrating a process (2) for manufacturing the humidity sensor according to the second embodiment.

Next, as illustrated in FIG. 14A, similar to the first embodiment, the protective film 16 is formed on the first humidity sensing film 15.

Figure 14B:
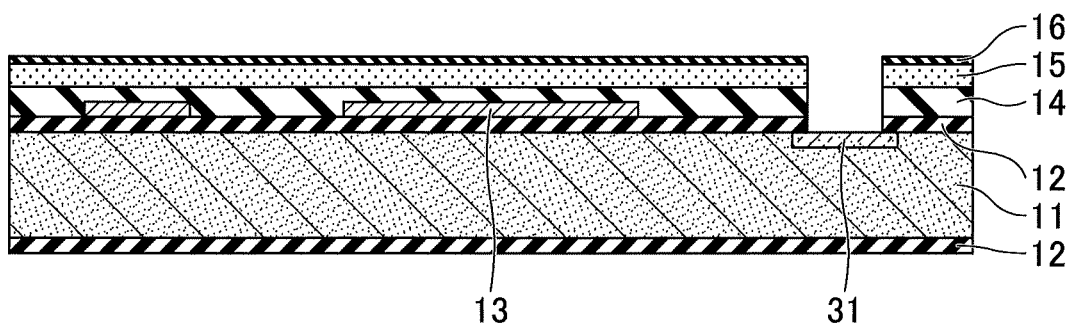
FIG. 14B is a cross-sectional view illustrating the process (2) for manufacturing the humidity sensor according to the second embodiment.

Next, as illustrated in FIG. 14B, a resist mask having an opening at a position corresponding to the electrode extraction opening is formed, and the protective film 14, the first humidity sensing film 15, and the protective film 16 are partially removed by reactive-ion etching (RIE). As a result, the contact layer 31 and the lower electrode 13 are partially exposed at the predetermined position.

Figure 14C:
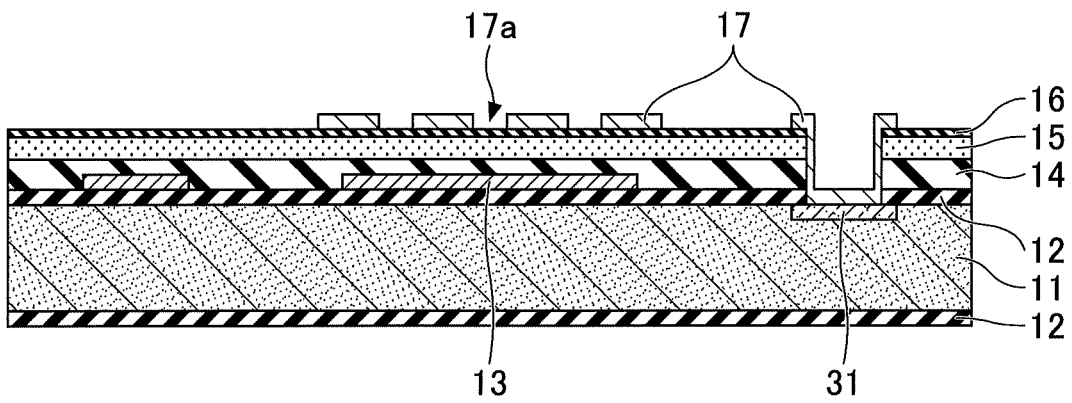
FIG. 14C is a cross-sectional view illustrating the process (2) for manufacturing the humidity sensor according to the second embodiment.

Next, as illustrated in FIG. 14C, the upper electrode 17 is formed on the protective film 16 and the contact layer 31. Accordingly, the upper electrode 17 is electrically connected to the substrate 11 via the contact layer 31 at the position where the electrode extraction opening is formed. Accordingly, the electric potential of the upper electrode 17 becomes equal to the electric potential of the substrate 11. As a result, it becomes possible to confine an electric field inside the first humidity sensing film 15, and reduce water and dust adhering to the humidity sensor 10B. Note that in order to form an ohmic contact (a contact) between the contact layer 31 and the upper electrode 17, a thermal treatment (sintering) may be performed after the upper electrode 17 is formed.

Figure 14D:
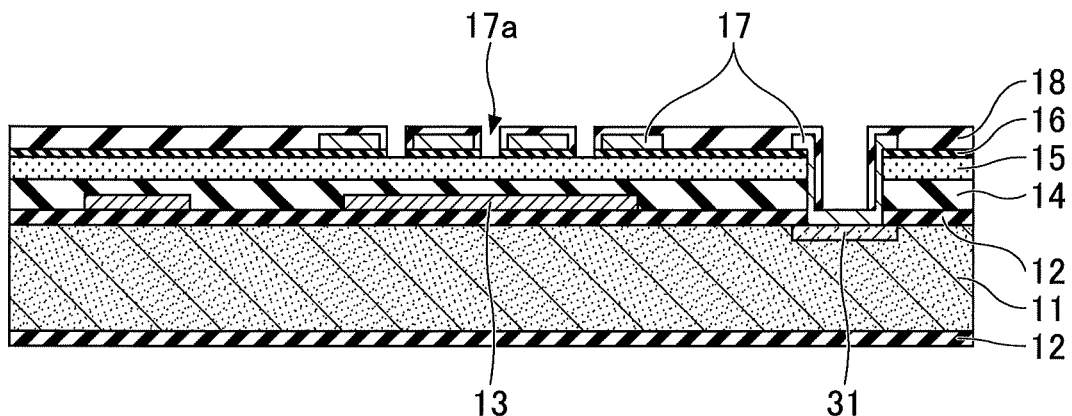
FIG. 14D is a cross-sectional view illustrating the process (2) for manufacturing the humidity sensor according to the second embodiment.

Next, as illustrated in FIG. 14D, similar to the first embodiment, the protective film 18 is formed so as to cover the upper electrode 17.

Figure 15A:
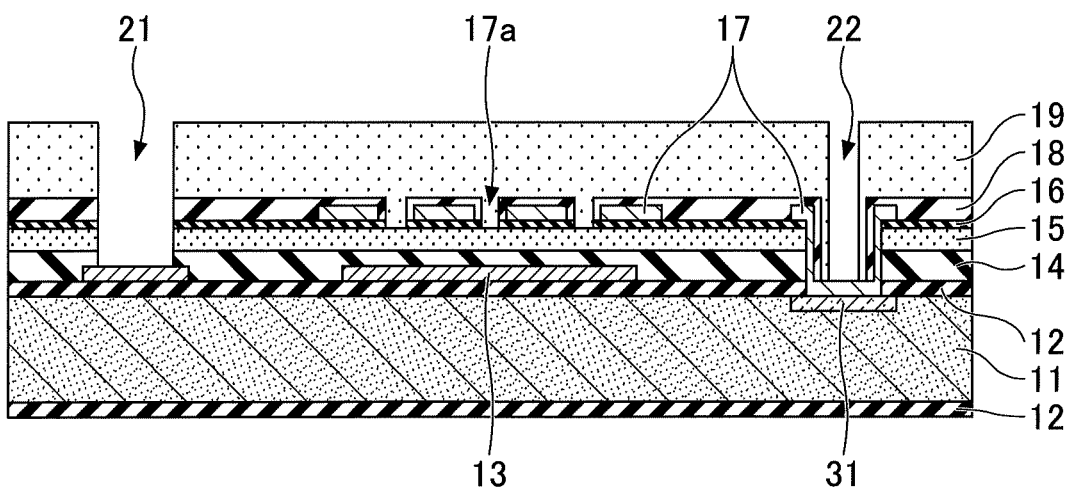
FIG. 15A is a cross-sectional view illustrating a process (3) for manufacturing the humidity sensor according to the second embodiment.

Next, as illustrated in FIG. 15A, similar to the first embodiment, the second humidity sensing film 19 is formed so as to cover the upper electrode 17.

Figure 15B:
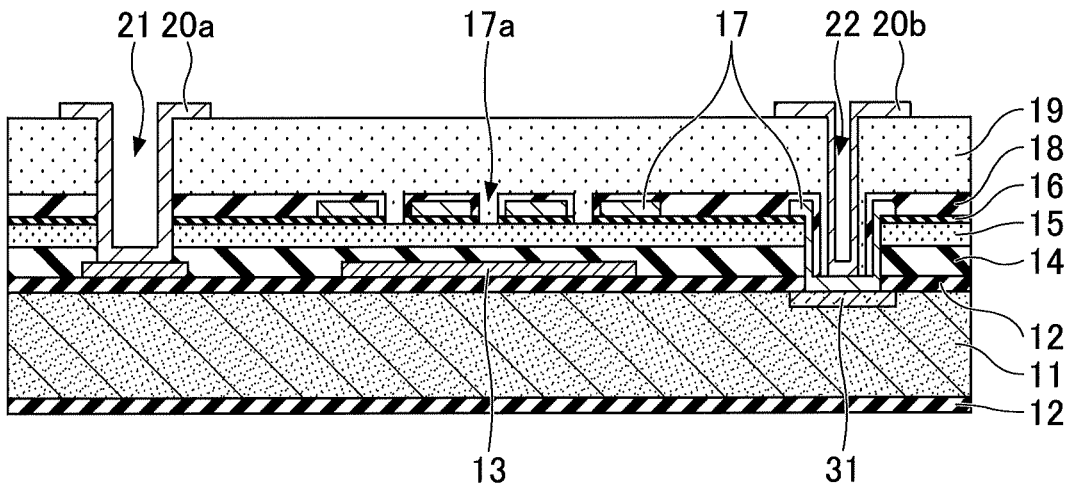
FIG. 15B is a cross-sectional view illustrating the process (3) for manufacturing the humidity sensor according to the second embodiment.

Next, as illustrated in FIG. 15B, similar to the first embodiment, the electrode pads 20a and 20b are respectively formed in the opening 21 and the opening 22.

Figure 15C:
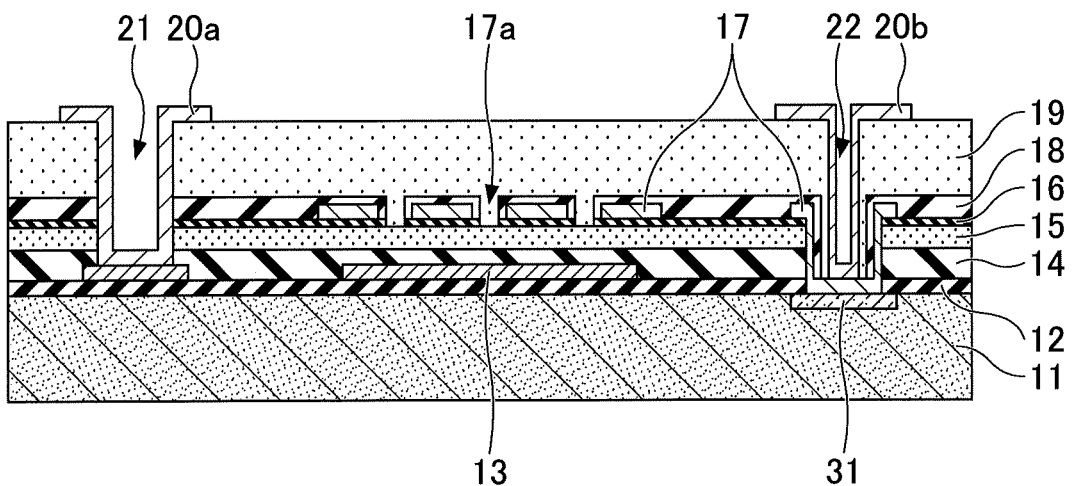
FIG. 15C is a cross-sectional view illustrating the process (3) for manufacturing the humidity sensor according to the second embodiment.

Next, as illustrated in FIG. 15C, similar to the first embodiment, the lower surface is ground.

With the above-described processes, the humidity sensor 10B illustrated in FIG. 12 can be manufactured.

EXAMPLES

Simulation results of Example 1 and Example 2 for verifying effects of the humidity sensors according to the embodiments will be described below.

Example 1

In Example 1, an electrostatic capacitance value (an arbitrary unit) is calculated by a simulation by varying the area (outline) of the upper electrode 17 with respect to the area (outline) of the lower electrode 13. Parameters for properties of the substrate 11, the insulating film 12, the first humidity sensing film 15, and the second humidity sensing film 19 are set as follows. Note that the area of the first humidity sensing film 15 is set larger than the area of the upper electrode 17. The substrate 11 is maintained at a floating electric potential during operation, and a humidity sensor is operated by setting the lower electrode 13 at 1 V and the upper electrode 17 at 0 V.
<Parameters>
Substrate 11: silicon substrate
Insulating film 12: $SiO_2$ film (a thickness of 5 μm and a relative dielectric constant of 3.9)
First humidity sensing film 15: PI film (a thickness of 1 μm, a relative dielectric constant of 3.69 when humidity is 0% Rh, and a relative dielectric constant of 4.19 when humidity is 100% Rh)
Second humidity sensing film 19: PI film (a thickness of 2 μm, a relative dielectric constant of 3.69 when humidity is 0% Rh, and a relative dielectric constant of 4.19 when humidity is 100% Rh)

Figure 16:
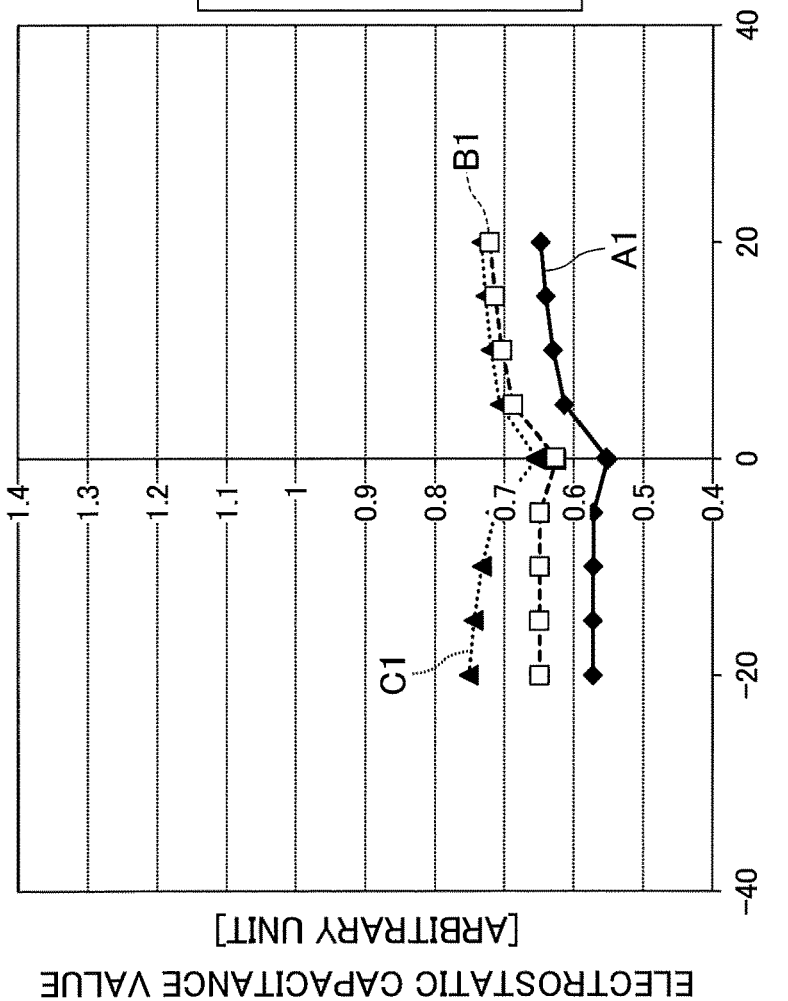
FIG. 16 is a diagram (1) illustrating effects of reducing the influence of water adhering to a humidity sensor according to Example 1.

FIG. 16 is a diagram illustrating effects of reducing the influence of water adhering to the humidity sensor according to Example 1. In the figure, the horizontal axis indicates a value (μm) obtained by subtracting the length of one side of the upper electrode 17 from the length of one side of the lower electrode 13. Namely, the value becomes 0 when the area of the upper electrode 17 is equal to the area of the lower electrode 13, becomes positive when the area of the upper electrode 17 is larger than the area of the lower electrode 13, and becomes negative when the area of the upper electrode 17 is smaller than the area of the lower electrode 13. The vertical axis indicates an electrostatic capacitance value (an arbitrary unit). Further, in the figure, a line A1 plotted with diamond marks indicates a change in the electrostatic capacitance value when the first humidity sensing film 15 is dry (relative humidity of 0% Rh and a relative dielectric constant of 3.69). A line B1 plotted with square marks indicates a change in the electrostatic capacitance value when the first humidity sensing film 15 is at high humidity (relative humidity of 100% Rh and a relative dielectric constant of 4.19). A line C1 plotted with triangle marks indicates a change in the electrostatic capacitance value when water adheres to the surface of the sensor (high humidity+water adhesion).

Figure 17:
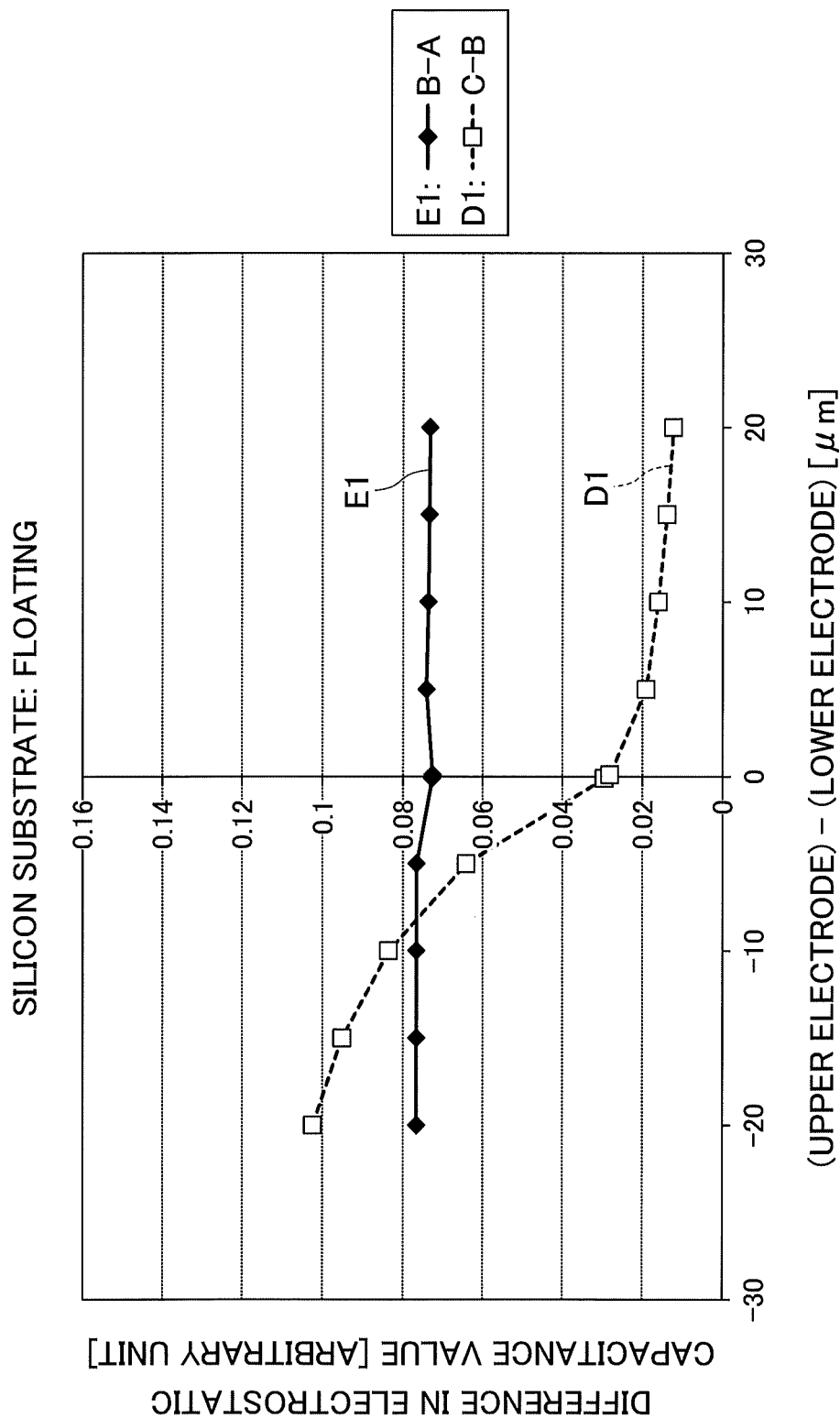
FIG. 17 is a diagram (2) illustrating effects of reducing the influence of water adhering to the humidity sensor according to Example 1.

FIG. 17 is a diagram illustrating effects reducing the influence of water adhering to the humidity sensor according to Example 1. In the figure, similar to FIG. 16, the horizontal axis indicates a value (μm) obtained by subtracting the length of one side of the upper electrode 17 from the length of one side of the lower electrode 13. The vertical axis indicates a difference (an arbitrary unit) in electrostatic capacitance value. Further, in the figure, a line D1 plotted with square marks indicates a difference between the line C1 and the line B1. A line E1 plotted with diamond marks indicates a difference between the line B1 and the line A1. The line D1, which is the difference between the line C1 and the line B1, indicates a change in the electrostatic capacitance value due to water adhesion. As the difference decreases, the influence of water adhesion decreases. The line E1, which is the difference between the line B1 and the line A1, indicates a difference between the high humidity condition and the dry condition. As the difference increases, the sensitivity of the humidity sensor increases.

As illustrated in FIG. 17, it can be seen that the difference in electrostatic capacitance value indicated by the line D1 decreases when the length of the upper electrode 17 is larger than the length of the lower electrode 13, as compared to when the length of the upper electrode 17 is smaller than the length of the lower electrode 13. Therefore, it is considered that the influence of water adhesion can be reduced by increasing the area of the upper electrode 17 relative to the area of the lower electrode 13.

Furthermore, as illustrated in FIG. 17, the difference in electrostatic capacitance value indicated by the line E1 does not significantly change by varying the length of the upper electrode 17 with respect to the length of the lower electrode 13. Therefore, it is considered that the same sensitivity is obtained between when the length of the upper electrode 17 is larger than the length of the lower electrode 13 and when the length of the upper electrode 17 is equal to or smaller than the length of the lower electrode 13.

Example 2

In Example 2, a simulation is performed under the same conditions as in Example 1, except that the electric potential of the substrate 11 is fixed at 0 V (grounded) during operation.

Figure 18:
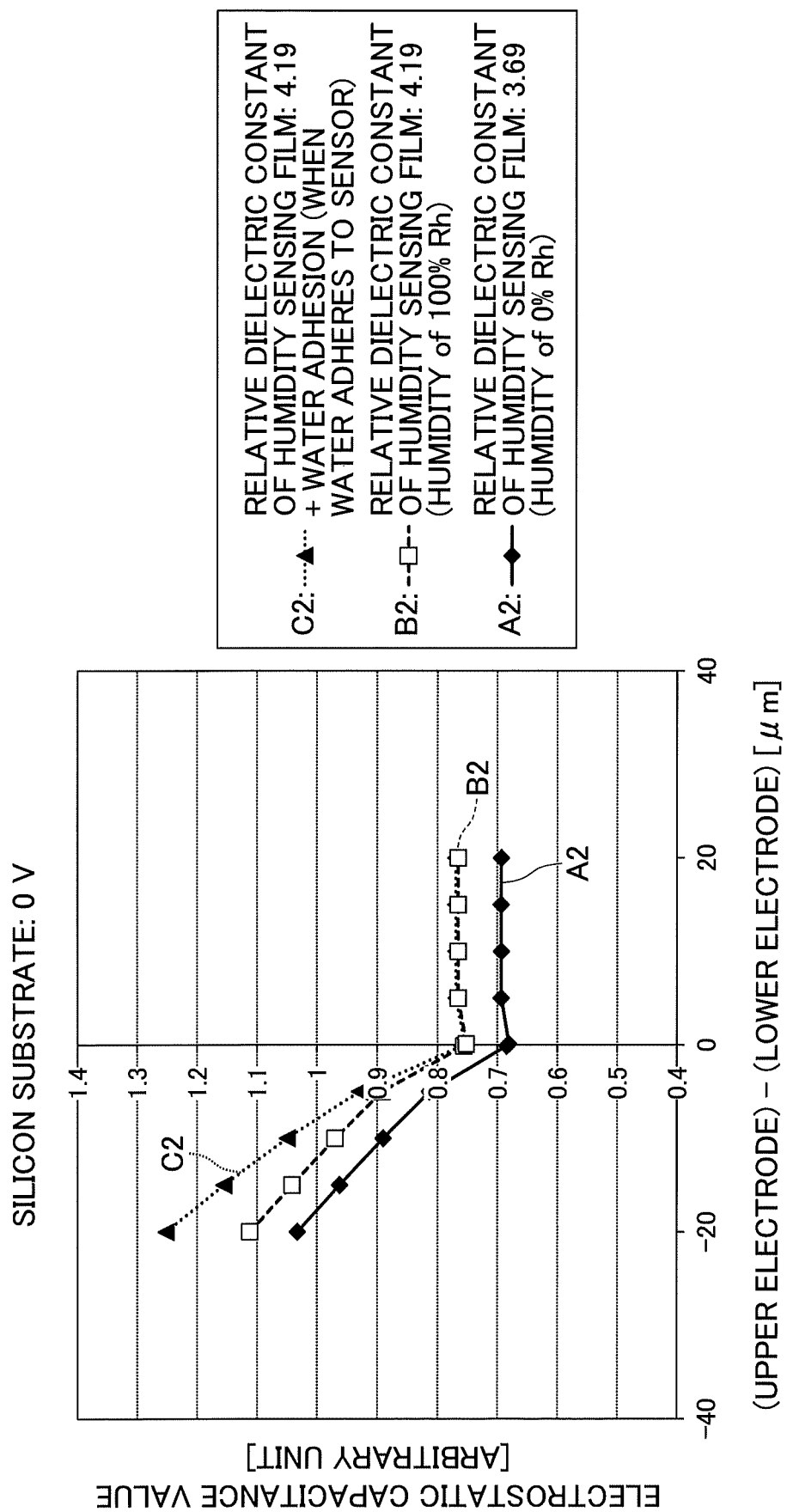
FIG. 18 is a diagram (1) illustrating effects of reducing the influence of water adhering to a humidity sensor according to Example 2.

FIG. 18 is a diagram illustrating effects of reducing the influence of water adhering to a humidity sensor according to Example 2. In the figure, the horizontal axis indicates a value (μm) obtained by subtracting the length of one side of the upper electrode 17 from the length of one side of the lower electrode 13. Namely, the value becomes 0 when the area of the upper electrode 17 is equal to the area of the lower electrode 13, becomes positive when the area of the upper electrode 17 is larger than the area of the lower electrode 13, and becomes negative when the area of the upper electrode 17 is smaller than the area of the lower electrode 13. The vertical axis indicates an electrostatic capacitance value (an arbitrary unit). Further, in the figure, a line A2 plotted with diamond marks indicates a change in the electrostatic capacitance value when the first humidity sensing film 15 is dry (relative humidity of 0% Rh and a relative dielectric constant of 3.69). A line B2 plotted with square marks indicates a change in the electrostatic capacitance value when the first humidity sensing film 15 is at high humidity (relative humidity of 100% Rh and a relative dielectric constant of 4.19). A line C2 plotted with triangle marks indicates a change in the electrostatic capacitance value when water adheres to the surface of the sensor (high humidity+water adhesion).

Figure 19:
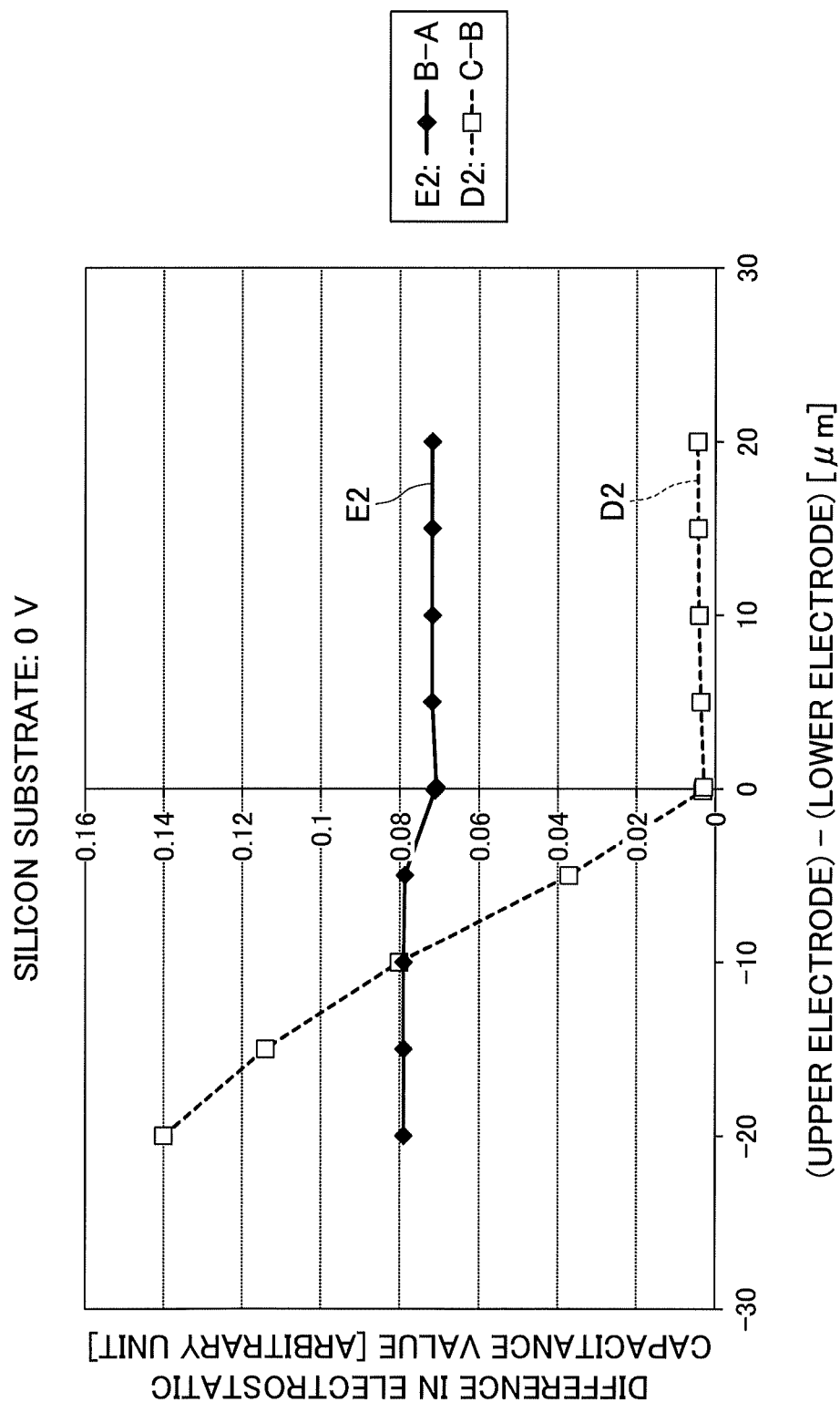
FIG. 19 is a diagram (2) illustrating effects of reducing the influence of water adhering to the humidity sensor according to Example 2.

FIG. 19 is a diagram illustrating effects of reducing the influence of water adhering to the humidity sensor according to Example 2. In the figure, similar to FIG. 18, the horizontal axis indicates a value (μm) obtained by subtracting the length of one side of the upper electrode 17 from the length of one side of the lower electrode 13. The vertical axis indicates a difference (an arbitrary unit) in electrostatic capacitance value. Further, in the figure, a line D2 plotted with square marks indicates a difference between the line C2 and the line B2. A line E2 plotted with diamond marks indicates a difference between the line B2 and the line A2. The line D2, which is the difference between line C2 and the line B2, indicates a change in the electrostatic capacitance value due to water adhesion. As the difference decreases, the influence of water adhesion decreases. The line E2, which is the difference between the line B2 and the line A2, indicates a difference between the high humidity condition and the dry condition. As the difference increases, the sensitivity of the humidity sensor increases.

As illustrated in FIG. 19, it can be seen that the difference in electrostatic capacitance value indicated by the line D2 decreases when the length of the upper electrode 17 is larger than the length of the lower electrode 13, as compared to when the length of the upper electrode 17 is smaller than the length of the lower electrode 13. Therefore, it is considered that the influence of water adhesion can be reduced by increasing the area of the upper electrode 17 relative to the area of the lower electrode 13.

Furthermore, as illustrated in FIG. 19, the difference in electrostatic capacitance value indicated by the line E2 does not significantly change by varying the length of the upper electrode 17 with respect to the length of the lower electrode 13. Therefore, it is considered that the same sensitivity is obtained between when the length of the upper electrode 17 is larger than the length of the lower electrode 13 and when the length of the upper electrode 17 is equal to or smaller than the length of the lower electrode 13.

Further, in Example 2 in which the electric potential of the substrate 11 is fixed at 0 V (grounded) during operation, it is considered that the influence of water adhesion can be significantly reduced as compared to Example 1 in which the substrate 11 is maintained at a floating electric potential during operation. Namely, the electric potential of the substrate 11 is preferably fixed at 0 V.

As described above, by making the area of the upper electrode 17 larger than the area of the lower electrode 13, and smaller than the first humidity sensing film 15, the influence of water adhering to the sensor can be reduced, thereby ensuring stable and accurate measurement.

Although the preferable embodiments have been described above, the present invention is not limited to the above-described embodiments, and variations and modifications may be made to the above-described embodiments without departing from the scope of the present invention recited in the claims.

In the above-described embodiments, an example in which the substrate 11 is the p-type silicon substrate has been described; however, the present invention is not limited thereto. The substrate 11 may be an n-type silicon substrate. In this case, it is preferable to electrically connect the upper electrode 17 to the substrate 11 as in the above-described embodiments. However, this case differs from the above-described embodiments, in that the electric potential of the lower electrode 13 is set to 0 V, and the upper electrode 17 and the substrate 11 are driven by a positive electric potential that is greater than the electric potential of the lower electrode 13. In addition, in the second embodiment, if an n-type silicon substrate is used as the substrate 11, an n+ layer may be formed as the contact layer 31 by doping a donor material such as phosphorus (P), antimony (Sb), or arsenic (As).

The present application is based on and claims priority to Japanese patent application No. 2017-071469 filed on Mar. 31, 2017, with the Japanese Patent Office, the entire contents of which are hereby incorporated by reference.

DESCRIPTION OF THE REFERENCE NUMERALS 10A, 10B humidity sensor
11 substrate
13 lower electrode
15 first humidity sensing film
17 upper electrode
17a opening
19 second humidity sensing film
22 opening

The invention claimed is:

1. A humidity sensor comprising:
a lower electrode formed above a substrate;
a first humidity sensing film covering the lower electrode;
an upper electrode formed above the first humidity sensing film, the upper electrode having a predetermined opening pattern; and
a second humidity sensing film covering the upper electrode and making contact with the first humidity sensing film through openings of the upper electrode,
wherein an area of the upper electrode is larger than an area of the lower electrode, and is smaller than an area of the first humidity sensing film;
wherein a thickness of the second humidity sensing film is larger than a thickness of the first humidity sensing film; and
wherein an electric potential of the substrate is fixed during operation.

2. The humidity sensor according to claim 1, wherein the upper electrode is electrically connected to the substrate.

3. The humidity sensor according to claim 2, wherein an opening is formed in the first humidity sensing film, and the upper electrode is electrically connected to the substrate via the opening.

4. The humidity sensor according to claim 2, wherein the upper electrode is electrically connected to the substrate outside the humidity sensor.

5. The humidity sensor according to claim 1, wherein the substrate is formed of a p-type semiconductor, and is grounded.

6. The humidity sensor according to claim 1, wherein the substrate is formed of an n-type semiconductor, and is maintained at a positive electric potential.

7. The humidity sensor according to claim 1, comprising a protective film that covers an entire area of the upper electrode.

8. The humidity sensor according to claim 1, comprising a resin that is formed on the second humidity sensing film so as to extend towards an outer periphery of the humidity sensor from a position between an outermost peripheral opening and an outer peripheral edge of the upper electrode.

9. A humidity sensor comprising:
a lower electrode formed above a substrate;

a first humidity sensing film covering the lower electrode;

an upper electrode formed above the first humidity sensing film, the upper electrode having a predetermined opening pattern; and a second humidity sensing film covering the upper electrode and making contact with the first humidity sensing film through openings of the upper electrode, wherein an area of the upper electrode is larger than an area of the lower electrode, and is smaller than an area of the first humidity sensing film;

wherein a thickness of the second humidity sensing film is larger than a thickness of the first humidity sensing film; and wherein an electric potential of the upper electrode is fixed during operation.

10. The humidity sensor according to claim 9, wherein the electric potential of the upper electrode is fixed to be equal to the electric potential of the substrate.

11. The humidity sensor according to claim 9, wherein the thickness of the second humidity sensing film is less than 10 times the thickness of the first humidity sensing film.

* * * * *